US012761250B2

(12) United States Patent
Utsunomiya

(10) Patent No.: US 12,761,250 B2
(45) Date of Patent: Oct. 13, 2026

(54) CURRENT DETECTION CIRCUIT

(71) Applicant: ABLIC Inc., Nagano (JP)

(72) Inventor: Fumiyasu Utsunomiya, Nagano (JP)

(73) Assignee: ABLIC Inc., Nagano (JP)

( * ) Notice: Subject to any disclaimer, the term of this patent is extended or adjusted under 35 U.S.C. 154(b) by 149 days.

(21) Appl. No.: 18/789,608

(22) Filed: Jul. 30, 2024

(65) Prior Publication Data

US 2025/0110158 A1 Apr. 3, 2025

(30) Foreign Application Priority Data

Sep. 29, 2023 (JP) ................................ 2023-169719

(51) Int. Cl.

*G01R 19/00* (2006.01)
*G01R 15/12* (2006.01)
*G01R 19/15* (2006.01)
*G01R 21/00* (2006.01)
*G01R 22/06* (2006.01)

(52) U.S. Cl.

CPC ................................ *G01R 19/0092* (2013.01)

(58) Field of Classification Search

CPC ........ G01R 19/00; G01R 19/15; G01R 15/12; G01R 21/00; G01R 22/06

See application file for complete search history.

(56) References Cited

FOREIGN PATENT DOCUMENTS

JP H0983452 * 3/1997 ............ H04B 10/28

* cited by examiner

*Primary Examiner* — Neel D Shah
(74) *Attorney, Agent, or Firm* — JCIPRNET

(57) ABSTRACT

A current detection circuit includes: an input port, an output port; a rectifying element; a current control circuit; a load element, a first transistor, which is a first conductivity type field effect transistor; and a voltage detection circuit including a voltage detection terminal and a detection result output port. The current control circuit includes a first terminal, connected to a first power source terminal, and a second terminal, connected to an anode terminal of the rectifying element, a drain of the first transistor, and the voltage detection terminal of the voltage detection circuit. A gate of the first transistor is configured to connect the input port and a cathode terminal of the rectifying element to a second power source terminal via the load element. The output port is connected to the detection result output port of the voltage detection circuit.

8 Claims, 4 Drawing Sheets

CURRENT DETECTION CIRCUIT

CROSS-REFERENCE TO RELATED APPLICATION

This application claims the priority benefits of Japanese application no. 2023-169719, filed on Sep. 29, 2023. The entirety of the above-mentioned patent application is hereby incorporated by reference herein and made a part of this specification.

BACKGROUND

Technical Field

The present invention relates to a current detection circuit.

Description of Related Art

A current detection circuit used in a light receiving circuit of an infrared remote controller (hereinafter referred to as "infrared remote controller") to separate the DC component from the signal component in the input current from the photodiode that receives the light and detect the signal component has been disclosed. The DC component in the input current is derived from ambient light such as sunlight or room illumination. The signal component in the input current is the signal component originating from the transmitter of the infrared remote controller Conventional current detection circuits detect signal components based on voltage changes in a resistor that occur in the case that a current change due to the signal component flows through the resistor. In the case that the amount of current change due to the signal component is very small, the change amount in the voltage at two ends of the resistor becomes very small. In the case that the amount of current change due to the signal component is very small, conventional current detection circuits are unable to detect the signal component.

The purpose of the present invention is to provide a current detection circuit capable of detecting the current change due to a very small signal component for the DC component in the input current.

SUMMARY

In accordance with an embodiment of the present invention, the current detection circuit includes: an input port; an output port; a rectifying element; a current control circuit; a rectifying element; a first transistor, which is a first conductivity type field effect transistor; and a voltage detection circuit including a voltage detection terminal and a detection result output port. The current control circuit includes a first terminal, connected to a first power source terminal, and a second terminal, connected to an anode terminal of the rectifying element, a drain of the first transistor, and a voltage detection terminal of the voltage detection circuit. The gate of the first transistor is configured to connect the input port and a cathode terminal of the rectifying element to a second power source terminal via the load element. The output port is connected to a detection result output port of the voltage detection circuit.

DESCRIPTION OF THE EMBODIMENTS

First Embodiment

Figure 1:
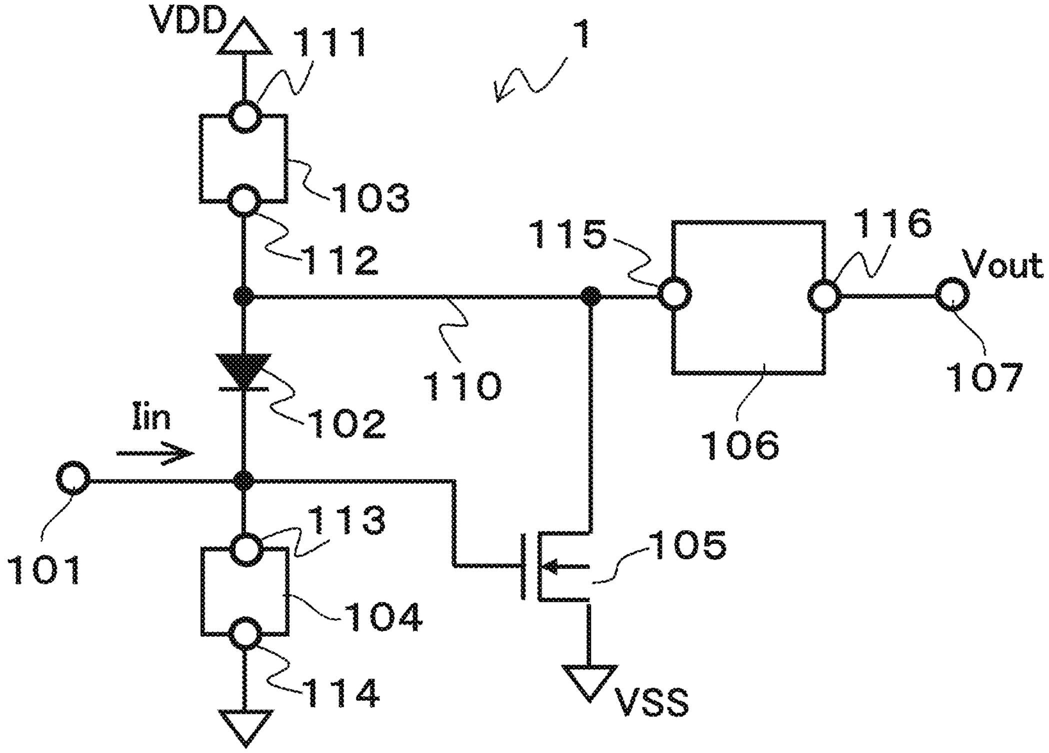
FIG. 1 is a circuit diagram illustrating one example of the current detection circuit according to the first embodiment of the present invention.
Figure 2:
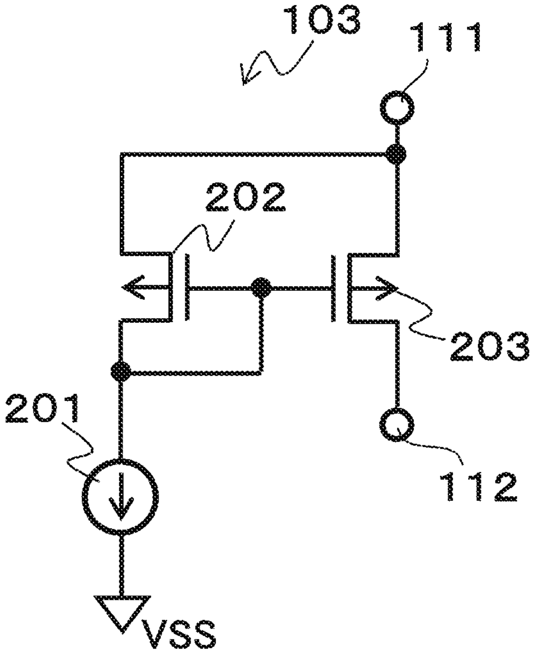
FIG. 2 is a circuit diagram illustrating one example of the current control circuit of the current detection circuit according to the first embodiment of the present invention.
Figure 3:
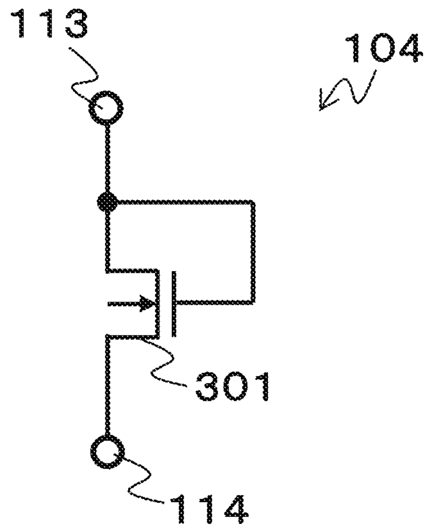
FIG. 3 is a circuit diagram illustrating one example of the load element of the current detection circuit according to the first embodiment of the present invention.
Figure 4:
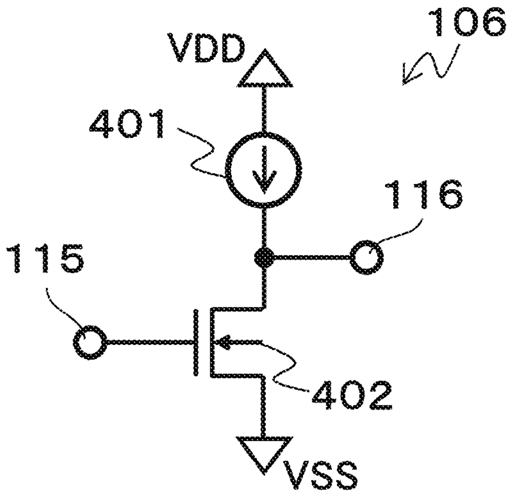
FIG. 4 is a circuit diagram illustrating one example of the voltage detection circuit of the current detection circuit according to the first embodiment of the present invention.

FIG. 1 is a circuit diagram of the current detection circuit 1 which is one example of the current detection circuit according to the first embodiment of the present invention. Further, FIG. 2 to FIG. 4 are circuit diagrams illustrating examples of the current control circuit 103, the load element 104, and the voltage detection circuit 106 of the current detection circuit 1, respectively. A current detection circuit according to the first embodiment is described with reference to FIG. 1 to FIG. 4.

The overall configuration of the current detection circuit 1 is described with reference to FIG. 1.

The current detection circuit 1 includes an input port 101, a rectifying element 102, a current control circuit 103, a load element 104, an N-channel MOS transistor (hereinafter referred to as "NMOS transistor") 105 which is an example of a field effect transistor, a voltage detection circuit 106, and an output port 107. The current control circuit 103 includes a power source terminal 111 and a current output port 112. The load element 104 includes a first end 113 and a second end 114. The voltage detection circuit 106 includes a voltage detection terminal 115 and a detection result output port 116.

The connections of the current detection circuit 1 is described below. The input port 101 is connected to a cathode terminal of the rectifying element 102, the gate of the NMOS transistor 105, and the first end 113 of the load element 104. A first node 110 is connected to an anode terminal of the rectifying element 102, the drain of the NMOS transistor 105, the voltage detection terminal 115, and the current output port 112 The detection result output port 116 is connected to the output port 107. The power source terminal 111 is connected to a positive power source terminal VDD. The second end 114 of the load element 104 is connected to a negative power source terminal VSS. The source of the NMOS transistor 105 is connected to the negative power source terminal VSS.

The current control circuit 103 is described with reference to FIG. 2.

The current control circuit 103 includes a constant current element 201 and P-channel type MOS transistors (hereinafter referred to as "PMOS transistors") 202 and 203 in addition to the power source terminal 111 and the current output port 112. The power source terminal 111 is connected to the source of the PMOS transistor 202 and the source of the PMOS transistor 203. The gate of the PMOS transistor 202 is connected to the drain of the PMOS transistor 202 and the gate of the PMOS transistor 203. The gate and drain of the PMOS transistor 202 and the gate of the PMOS transistor 203 are further connected to the negative power source terminal VSS via the constant current element 201. The drain of the PMOS transistor 203 is connected to the current output port 112.

With the above-mentioned configuration, the current control circuit 103 has a constant current flowing through the constant current element 201 mirrored to the drain current of the PMOS transistor 203 via the PMOS transistor 202, and output from the current output port 112.

The load element 104 is described with reference to FIG. 3.

In addition to the first end 113 and the second end 114, the load element 104 includes a so-called diode-connected NMOS transistor 301 having the same threshold voltage as the NMOS transistor 105 (FIG. 1). More specifically, the first end 113 is connected to the drain and the gate of the NMOS transistor 301. The second end 114 is connected to the source of the NMOS transistor 301.

The voltage detection circuit 106 is described with reference to FIG. 4. The voltage detection circuit 106 includes a constant current element 401 and an NMOS transistor 402 having the same threshold voltage as the NMOS transistor 105 (FIG. 1) in addition to the voltage detection terminal 115 and the detection result output port 116. The voltage detection terminal 115 is connected to the gate of the NMOS transistor 402. The drain of the NMOS transistor 402 is connected to a second end of the constant current element 401 and to the detection result output port 116. A first end of the constant current element 401 is connected to the positive power source terminal VDD. The source of the NMOS transistor 402 is connected to the negative power source terminal VSS.

With the above-described configuration, the voltage detection circuit 106 switches a voltage level of a detection signal output from the detection result output port 116 corresponding to whether the voltage of the voltage detection terminal 115 is lower than the threshold voltage of the NMOS transistor 402. In the case that the voltage of the voltage detection terminal 115 of the illustrated voltage detection circuit 106 is lower than the threshold voltage of the NMOS transistor 402, a detection signal having the voltage level of the positive power source terminal VDD is output from the detection result output port 116.

Next, the operation of the current detection circuit 1 is described below. First, a case is described in which an input current Iin received by the input port 101 of the current detection circuit 1 does not contain a signal component, that is, the current value does not change.

The current control circuit 103 supplies a constant current to the first node 110. A portion of the constant current supplied from the current control circuit 103 to the first node 110 flows to the negative power source terminal VSS via the rectifying element 102 and the load element 104, and the remaining current flows to the negative power source terminal VSS via the NMOS transistor 105. The voltage generated in the load element 104 is received by the gate of the NMOS transistor 105. The NMOS transistor 105 controls the drain current so that the sum of the current flowing to the negative power source terminal VSS via the rectifying element 102 and the load element 104 and the current flowing to the drain is equal to the constant current from the current control circuit 103. Since the sum of the drain current of the NMOS transistor 105 and the current flowing to the negative power source terminal VSS via the rectifying element 102 and the load element 104 is controlled to be equal to the constant current from the current control circuit 103, the voltage of the first node 110 becomes the sum of the threshold voltage of the NMOS transistor 105 and the forward voltage of the rectifying element 102.

The voltage detection circuit 106 receives the voltage of the first node 110 at the voltage detection terminal 115. Since the voltage of the voltage detection terminal 115, that is, the voltage supplied to the gate of the NMOS transistor 402 (FIG. 4), exceeds the threshold voltage of the NMOS transistor 402, a signal of the voltage level of the negative power source terminal VSS is output from the detection result output port 116. The signal of the voltage level of the negative power source terminal VSS output from the detection result output port 116 is transmitted to the output port 107 and output from the output port 107. The detection signal of the voltage level of the negative power source terminal VSS corresponds to a state in which the input current Iin received by the input port 101 does not contain a signal component.

Next, a case is described in which the input current Iin received by the input port 101 of the current detection circuit 1 transitions from a state in which it does not contain a signal component to a state in which it contains a signal component, that is, a case in which the input current Iin transitions from a state in which the current value does not change to a state in which the current value changes.

In the case that the input current Iin is received by the input port 101, the voltage generated in the load element 104 increases. In the case that the voltage generated in the load element 104 increases, since the voltage of the gate of the NMOS transistor 105 increases, the current value of the drain current of the NMOS transistor 105 increases. In the case that the current value of the drain current of the NMOS transistor 105 increases, since it exceeds the constant current value from the current control circuit 103, the voltage of the first node 110 becomes the voltage of the voltage level of the negative power source terminal VSS.

In the case that the voltage of the first node 110 becomes the voltage of the voltage level of the negative power source terminal VSS, the voltage of the voltage detection terminal 115 of the voltage detection circuit 106 falls below the threshold voltage of the NMOS transistor 402 (FIG. 4), so that the voltage detection circuit 106 outputs a detection signal of the voltage level of the positive power source terminal VDD from the detection result output port 116. The detection signal of the voltage level of the positive power source terminal VDD output from the detection result output port 116 is transmitted to the output port 107 and output from the output port 107. The detection signal of the voltage level of the positive power source terminal VDD corresponds to a state in which the input current Iin received by the input port 101 contains a signal component.

According to this embodiment, the current detection circuit 1 includes an NMOS transistor 105 connected to the negative power source terminal VSS, which includes a drain and a gate connected to each other via the rectifying element 102, and the first end 113 of the load element 104 is connected to the cathode as one end of the rectifying element 102. A voltage, which is generated in the case that a constant current supplied to the drain of the NMOS transistor 105 is supplied to the load element 104 and flows therethrough, is applied to the gate of the NMOS transistor 105. Thus, the current detection circuit 1 is capable of detecting a change in the input current flowing from the input port 101 to the load element 104 by the change in the voltage at the drain of NMOS transistor 105. Accordingly, the current detection circuit 1 is capable of detecting a current change due to a very small signal component for the DC component in the input current Iin received by the input port 101.

Second Embodiment

Figure 5:
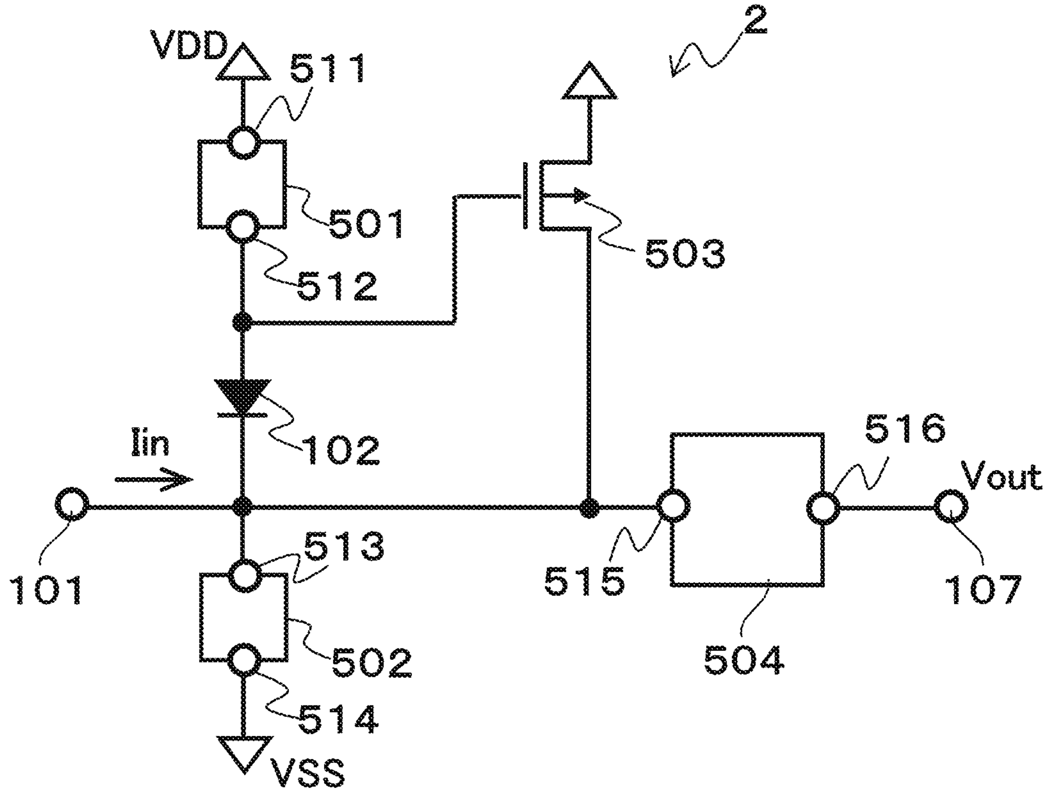
FIG. 5 is a circuit diagram illustrating one example of the current detection circuit according to the second embodiment of the present invention.
Figure 6:
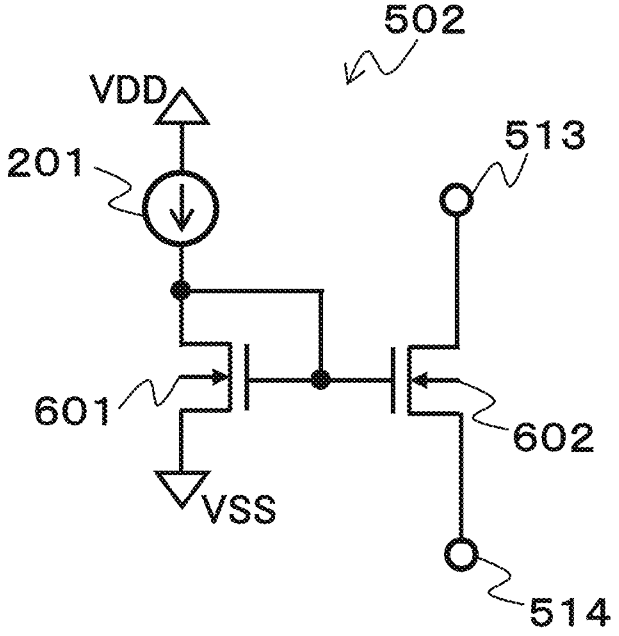
FIG. 6 is a circuit diagram illustrating one example of the current control circuit of the current detection circuit according to the second embodiment of the present invention.
Figure 7:
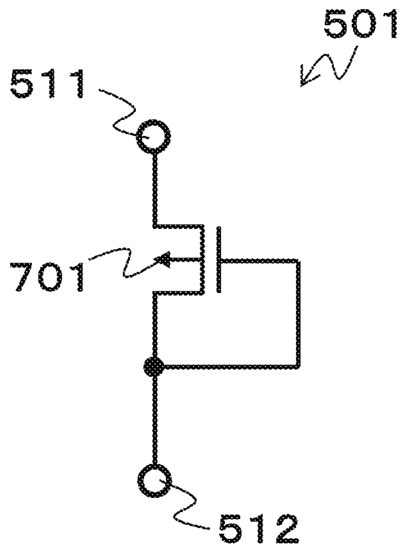
FIG. 7 is a circuit diagram illustrating one example of the load element of the current detection circuit according to the second embodiment of the present invention.
Figure 8:
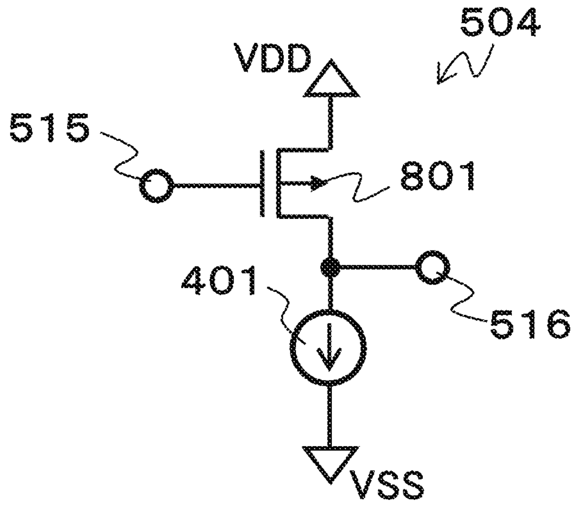
FIG. 8 is a circuit diagram illustrating one example of the voltage detection circuit of the current detection circuit according to the second embodiment of the present invention.

FIG. 5 is a circuit diagram of the current detection circuit 2 which is one example of the current detection circuit according to the second embodiment of the present invention. Further, FIG. 6 to FIG. 8 are circuit diagrams illustrating examples of the current control circuit 502, the load element 501, and the voltage detection circuit 504 of the current detection circuit 2, respectively. The current detection circuit according to the second embodiment is described with reference to FIG. 5 to FIG. 8.

The current detection circuit 2 differs from the current detection circuit 1 in that the polarity of the power source and the transistors is swapped, but there are no substantial differences in other respects. Thus, components that are substantially the same as those in the current detection circuit 1 are given the same reference numerals and description thereof is omitted.

The overall configuration of the current detection circuit 5 is described with reference to FIG. 2.

The current detection circuit 2 includes an input port 101, a rectifying element 102, a load element 501, a current control circuit 502, a PMOS transistor 503, which is an example of a field effect transistor, a voltage detection circuit 504, and an output port 107. The load element 501 includes a first end 511 and a second end 512. The current control circuit 502 includes a current drawing terminal 513 and a power source terminal 514. The voltage detection circuit 504 includes a voltage detection terminal 515 and a detection result output port 516.

The connections of the current detection circuit 2 is described below. The input port 101 is connected to the cathode terminal of the rectifying element 102, the drain of the PMOS transistor 503, the current drawing terminal 513 of the current control circuit 502, and the voltage detection terminal 515 of the voltage detection circuit 504. The detection result output port 516 of the voltage detection circuit 504 is connected to the output port 107. The anode terminal of the rectifying element 102 is connected to the gate of the PMOS transistor 503 and the second end 512 of the load element 501. The first end 511 of the load element 501 and the source of the PMOS transistor 503 are connected to the positive power source terminal VDD. The power source terminal 514 of the current control circuit 502 is connected to the negative power source terminal VSS.

The current control circuit 502 is described with reference to FIG. 6.

The current control circuit 502 includes a constant current element 201 and NMOS transistors 601, 602, in addition to the current drawing terminal 513 and the power source terminal 514. A first end of the constant current element 201 is connected to the positive power source terminal VDD. A second end of the constant current element 201 is connected to the drain and the gate of the NMOS transistor 601 and the gate of the NMOS transistor 602. The drain of the NMOS transistor 602 is connected to the current drawing terminal 513. The source of the NMOS transistor 602 is connected to the power source terminal 514. The source of the NMOS transistor 601 is connected to the negative power source terminal VSS.

In the current control circuit 502, with the above-mentioned configuration, the constant current flowing through the constant current element 201 is mirrored to the drain current of the NMOS transistor 602 via the NMOS transistors 601 and 602, and is drawn from the current drawing terminal 513.

The load element 501 is described with reference to FIG. 7.

In addition to the first end 511 and the second end 512, the load element 501 includes a so-called diode-connected PMOS transistor 701 having the same threshold voltage as a PMOS transistor (FIG. 5). More specifically, the first end 511 is connected to the source of the PMOS transistor 701. The second end 512 is connected to the drain and gate of the PMOS transistor 701.

The voltage detection circuit 504 is described with reference to FIG. 8.

In addition to the voltage detection terminal 515 and the detection result output port 516, the voltage detection circuit 504 includes a constant current element 401 and a PMOS transistor 801 having the same threshold voltage as the PMOS transistor 503 (FIG. 5). The voltage detection terminal 515 is connected to the gate of the PMOS transistor 801. The drain of the PMOS transistor 801 is connected to a second end of the constant current element 401 and the detection result output port 516. The first end of the constant current element 401 is connected to the negative power source terminal VSS. The source of the PMOS transistor 801 is connected to the positive power source terminal VDD.

With the above-mentioned configuration, the voltage detection circuit 504 switches a voltage level of a detection signal output from the detection result output port 516 corresponding to whether the voltage of the voltage detection terminal 515 is higher than the threshold voltage of the PMOS transistor 801. In the case that the voltage of the voltage detection terminal 515 of the illustrated voltage detection circuit 504 exceeds the threshold voltage of the PMOS transistor 801, a detection signal having the voltage level of the negative power source terminal VSS is output from the detection result output port 516.

The current detection circuit 2 configured as described above operates in the same manner as the current detection circuit 1.

According to this embodiment, the current detection circuit 2 includes a PMOS transistor 503 connected to the positive power source terminal VDD, which includes a drain and a gate connected to each other via the rectifying element 102, and a second end 512 of the load element 501 is connected to the anode as one end of the rectifier element 102. A voltage, which is generated in the case that a constant current supplied to the drain of the PMOS transistor 503 is supplied to the load element 501 and flows therethrough, is applied to the gate of the PMOS transistor 503. Thus, the current detection circuit 2 is capable of detecting a change in the input current flowing from the input port 101 to the load element 501 by the change in the voltage of the drain of the PMOS transistor 503. Accordingly, the current detection circuit 2 is capable of detecting a current change due to a very small signal component for the DC component in the input current Iin received by the input port 101.

The present invention is not limited to the above-mentioned embodiment, and may be implemented in various forms other than the above-mentioned examples at the implementation stage, and various omissions, additions, substitutions, or modifications may be made without departing from the gist of the invention. For example, in the above-mentioned embodiment, the current control circuits 103 (see FIG. 2) and 502 (see FIG. 6), the load elements 104 (see FIG. 3) and 501 (see FIG. 7), and the voltage detection circuits 106 (see FIG. 4), 504 (see FIG. 8) are not limited to the illustrated configurations.

The current control circuit 103 may have any circuit configuration as long as it is a circuit that is capable of controlling the current supplied from the current output port 112. The illustrated current control circuit 103 is an example in which a configuration is applied in which the voltage of the current output port 112 may operate even in the case that the voltage of the current output port 112 is close to the voltage of the power source terminal 111 and the parasitic capacitance of the current output port 112 is small, but the current control circuit 103 may be, for example, a circuit including only a resistor element. As with the current control circuit 103, the current control circuit 502 may have any circuit configuration as long as it is a circuit capable of controlling the current supplied from the current drawing terminal 513.

The load elements 104 and 501 may be any type of element that generates a voltage due to a current flowing therethrough. The illustrated load element 104 is an NMOS transistor 301, which is suitable in that it generates a voltage even in the case that a small current flows therethrough (see FIG. 3), but the load element 104 may be a resistor element, a diode, or a combination of these, etc., as appropriate. The load element 501 illustrated in the example is a PMOS transistor 701, which is suitable in that it generates a voltage even in the case that a small current flows through it (see FIG. 7), but the load element 501 may be a resistor element, a diode, or a combination of these, etc., as appropriate.

The current detection circuit 1 may be configured to detect even minute currents, such as the photocurrent of a photodiode or the receiving current of radio waves, and there are no limitations on the current to be detected. In the case that the supply voltage of the current to be detected is low, the current to be detected may be received by the voltage detection terminal 115 via a capacitor, thereby detecting such a current with a low supply voltage. As with the current detection circuit 1, there are no limitations on the current to be detected with the current detection circuit 2.

The MOS transistors in the above-mentioned embodiments are not limited to MOSFETs, and other field effect transistors such as junction field effect transistors (JFETs) and metal-insulator-semiconductor field effect transistors (MISFETs) may also be applied.

These embodiments and their modifications are included within the scope and gist of the invention, as well as within the scope of the invention described in the claims and its equivalents.

What is claimed is:

1. A current detection circuit, comprising:

an input port;

an output port;

a rectifying element;

a current control circuit, a load element;

a first transistor, which is a first conductivity type field effect transistor; and a voltage detection circuit, comprising a voltage detection terminal and a detection result output port, the current control circuit comprising:

a first terminal, connected to a first power source terminal; and a second terminal, connected to an anode terminal of the rectifying element, a drain of the first transistor, and a voltage detection terminal of the voltage detection circuit, wherein a gate of the first transistor is configured to connect the input port and a cathode terminal of the rectifying element to a second power source terminal via the load element, and the output port is connected to a detection result output port of the voltage detection circuit, wherein the current control circuit is configured to supply a constant current via the second terminal.

2. The current detection circuit according to claim 1, the current control circuit comprising:

a second transistor and a third transistor, which are second conductivity type field effect transistors; and a first constant current element, the first constant current element comprising:

a first end, connected to a gate and a drain of the second transistor and a gate of the third transistor; and a second end, connected to the second power source terminal, wherein a source of each of the second transistor and the third transistor is connected to the first terminal, and a drain of the third transistor is connected to the second terminal.

3. The current detection circuit according to claim 1, the load element comprising:

a fourth transistor, which is a first conductivity type field effect transistor, and the load element including a first end connected to a gate and a drain of the fourth transistor and a second end connected to a source of the fourth transistor.

4. The current detection circuit according to claim 1, the voltage detection circuit comprising:

a fifth transistor, which is a first conductivity type field effect transistor; and a second constant current element, and wherein a first end of the second constant current element is connected to the first power source terminal, a source of the fifth transistor is connected to the second power source terminal, a gate of the fifth transistor is connected to the voltage detection terminal, and a drain of the fifth transistor is connected to a second end of the second constant current element and the detection result output port.

5. A current detection circuit, comprising:

an input port;

an output port;

a rectifying element;

a current control circuit, a load element;

a first transistor, which is a first conductivity type field effect transistor; and a voltage detection circuit, comprising a voltage detection terminal and a detection result output port, the current control circuit comprising:

a first terminal, connected to a first power source terminal; and a second terminal, connected to the input port, a cathode terminal of the rectifying element, a drain of the first transistor, and a voltage detection terminal of the voltage detection circuit, and wherein a gate of the first transistor is configured to connect an anode terminal of the rectifying element to a second power source terminal via the load element, and the output port is connected to a detection result output port of the voltage detection circuit.

6. The current detection circuit according to claim 5, the current control circuit comprising:

a second transistor and a third transistor, which are second conductivity type field effect transistors; and a first constant current element, the first constant current element comprising:

a first end, connected to a gate and a drain of the second transistor and a gate of the third transistor; and a second end, connected to the second power source terminal, wherein a source of the second transistor is connected to the first power source terminal, a source of the third transistor is connected to the first terminal, and a drain of the third transistor is connected to the second terminal.

7. The current detection circuit according to claim 5, the load element comprising:

a fourth transistor, which is a first conductivity type field effect transistor, and the load element including a first end connected to a source of the fourth transistor and a second end connected to a gate and a drain of the fourth transistor.

8. The current detection circuit according to claim 5, the voltage detection circuit comprising:

a fifth transistor, which is a first conductivity type field effect transistor; and a second constant current element, and wherein a first end of the second constant current element is connected to the first power source terminal, a source of the fifth transistor is connected to the second power source terminal, a gate of the fifth transistor is connected to the voltage detection terminal, and a drain of the fifth transistor is connected to a second end of the second constant current element and the detection result output port.

* * * * *